(12) United States Patent
Kuo et al.

(10) Patent No.: US 9,741,614 B1
(45) Date of Patent: Aug. 22, 2017

(54) METHOD OF PREVENTING TRENCH DISTORTION

(71) Applicant: UNITED MICROELECTRONICS CORP., Hsin-Chu (TW)

(72) Inventors: Chih-Wei Kuo, Tainan (TW); Yu-Tsung Lai, Tainan (TW); Jiunn-Hsiung Liao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/206,330

(22) Filed: Jul. 11, 2016

(51) Int. Cl.
| | |
|---|---|
| *H01L 21/768* | (2006.01) |
| *H01L 21/311* | (2006.01) |
| *H01L 21/02* | (2006.01) |
| *H01L 21/033* | (2006.01) |
| *H01L 21/027* | (2006.01) |

(52) U.S. Cl.
CPC .. *H01L 21/76897* (2013.01); *H01L 21/02063* (2013.01); *H01L 21/0273* (2013.01); *H01L 21/0332* (2013.01); *H01L 21/0337* (2013.01); *H01L 21/31144* (2013.01); *H01L 21/76802* (2013.01); *H01L 21/76877* (2013.01)

(58) Field of Classification Search
None
See application file for complete search history.

(56) References Cited

U.S. PATENT DOCUMENTS

| | | | | |
|---|---|---|---|---|
| 5,811,358 | A | * | 9/1998 | Tseng ................ H01L 21/31138 204/192.36 |
| 6,235,453 | B1 | | 5/2001 | You |
| 8,623,770 | B1 | | 1/2014 | Gao |
| 2009/0029543 | A1 | * | 1/2009 | Rothwell .......... H01L 21/02063 438/631 |
| 2014/0295650 | A1 | * | 10/2014 | Li .......................... H01L 21/308 438/482 |
| 2014/0346575 | A1 | * | 11/2014 | Chen ................. H01L 21/76897 257/288 |

* cited by examiner

*Primary Examiner* — Bilkis Jahan
(74) *Attorney, Agent, or Firm* — Winston Hsu

(57) ABSTRACT

A method of forming trenches and a via by self-aligned double patterning includes providing a dielectric layer covered by an SiOC layer, a TiN layer and a SiON layer from top to bottom. At least two mandrels are formed on the SiOC layer. Later, two spacers are formed respectively at two sidewalls of each mandrel. Subsequently, the mandrels are removed. The SiOC layer and the TiN layer are patterned by using the spacers to form numerous recesses. The spacers are then removed. A mask layer with a via pattern is formed to cover the SiOC layer. A via is formed in the dielectric layer by taking the mask layer as a mask. After that, the mask layer is removed. Finally, numerous trenches are formed in the dielectric layer by taking the SiOC layer and the TiN layer as a mask.

17 Claims, 5 Drawing Sheets

METHOD OF PREVENTING TRENCH DISTORTION

BACKGROUND OF THE INVENTION

1. Field of the Invention

The present invention relates to a method of forming trenches and a via, and more particularly, to forming trenches and a via without distortion on their sidewalls.

2. Description of the Prior Art

In semiconductor manufacturing, a damascene process, which patterns inlaid metal in preformed grooves, is a preferred method of fabricating interconnections for integrated circuits. Damascene wiring interconnects are formed by depositing a dielectric layer on a planar surface, patterning the dielectric layer using photolithography, then filling the recesses with conductive metal.

Due to an increased demand for highly integrated semiconductor memory devices, techniques for integrating more interconnections onto a small area have become strongly relied upon. The integration involves downscaling the devices to be formed on a semiconductor substrate. The downscaling has a limit based on the wavelength of a light source used in a photolithography process, which determines the dimensions of a device. This wavelength is reaching technical limitations.

To overcome this drawback, a method of forming interconnection patterns which are smaller than the conventional patterns is needed.

SUMMARY OF THE INVENTION

A first preferred embodiment of the present invention comprises providing a dielectric layer covered by a first mask and a second mask, wherein the first mask has a first stress, and the second mask has a second stress, wherein the first stress and the second stress are opposite in sign. Later, at least two mandrels are formed on the second mask. After that, two spacers are respectively formed at two sidewalls of each mandrel. Subsequently, the mandrels are removed. Then, the second mask is patterned by taking the spacers as a mask to form a plurality of recesses. Later, the spacers are removed. A third mask is formed to cover the second mask, and the third mask includes a via pattern. A via is formed in the dielectric layer by taking the third mask as a mask. After that, the third mask is removed. Finally, numerous trenches are formed in the dielectric layer by taking the second mask as a mask.

A second preferred embodiment of the present invention comprises providing a dielectric layer covered by an SiOC layer, a TiN layer and an SiON layer from top to bottom. At least two mandrels are formed on the SiOC layer. Later, two spacers are formed respectively at two sidewalls of each mandrel. Subsequently, the mandrels are removed. The SiOC layer and the TiN layer are patterned by using the spacers to form numerous recesses, and then the spacers are removed. After that, a mask layer with a via pattern is formed to cover the SiOC layer. Subsequently, a via is formed in the dielectric layer by taking the mask layer as a mask. After that, the mask layer is removed. Finally, numerous trenches are formed in the dielectric layer by taking the SiOC layer and the TiN layer as a mask.

A third preferred embodiment of the present invention comprises providing a dielectric layer covered by a mask with a via pattern thereon. A via is formed in the dielectric layer by taking the mask as a mask. Finally, the mask is removed by a first ashing process performed in plasma containing oxygen, followed by preforming a second ashing process in plasma containing nitrogen and hydrogen.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 depicts methods of forming trenches and a via within a dielectric layer according to a preferred embodiment of the present invention, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7;
FIG. 9 is a fabricating stage following FIG. 8; and
FIG. 10 is a fabricating stage following FIG. 9.

DETAILED DESCRIPTION

Trenches formed in a dielectric layer by a conventional self-aligned double patterning process always have distortion. There are three different methods for preventing distortion in the present invention. Each method can be performed independently. Furthermore, not all of the methods have to be used; as long as at least one of the three methods is utilized in the process, the distortion can be reduced.

Figure 1:
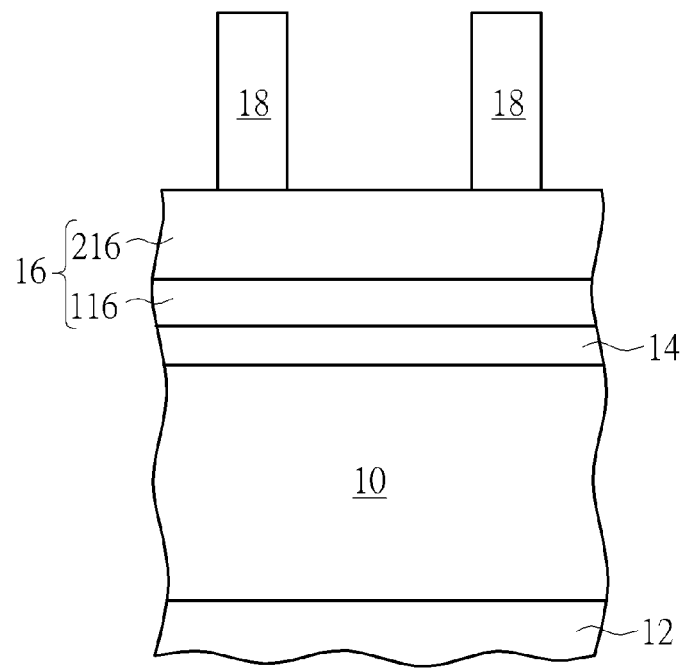

FIG. 1 to FIG. 10 depicts methods of forming trenches and a via within a dielectric layer according to the preferred embodiments of the present invention. As shown in FIG. 1, a dielectric layer 10 is provided. The dielectric layer 10 is disposed on an etching stop layer 12. The dielectric layer 10 may include $SiO_2$, or low-k materials. The low-k material is preferably silicon based carbon-doped oxide film, such as SiOCH, although the present invention is not limited to a particular low-k material. Other low-k dielectrics, such as polymer-based low-k materials (like polyimide), hydrogen silsequioxane and methyl silsequioxane, may also be employed. The etching stop layer 12 may be nitrogen-doped silicon carbide layer (NDC). Furthermore, there may be a substrate (not shown) including conductive lines disposed under the etching stop layer 12. A first mask 14 and a second mask 16 are formed in sequence to cover the dielectric layer 10. The first mask 14 has a first stress, and the second mask 16 has a second stress.

According to the first method of preventing the distortion in the present invention, the first stress and the second stress are opposite in sign. For example, if the first stress is tensile stress, the second stress is compressive stress, and if the first stress is compressive stress, the second stress is tensile stress. Based on a preferred embodiment of the present invention, the first mask 14 is preferably a SiON layer. The second mask 16 preferably includes a TiN layer 116 and a SiOC layer 216. The TiN layer 116 contacts the first mask 14. The SiOC layer 216 is on the TiN layer 116. The first mask 14 preferably has tensile stress, and the second mask 16 preferably has compressive stress. For example, the SiON layer, which is the first mask 14, preferably has tensile stress, and the TiN layer 116 and the SiOC layer 216, which comprise the second mask 16, together have compressive stress.

Figure 2:
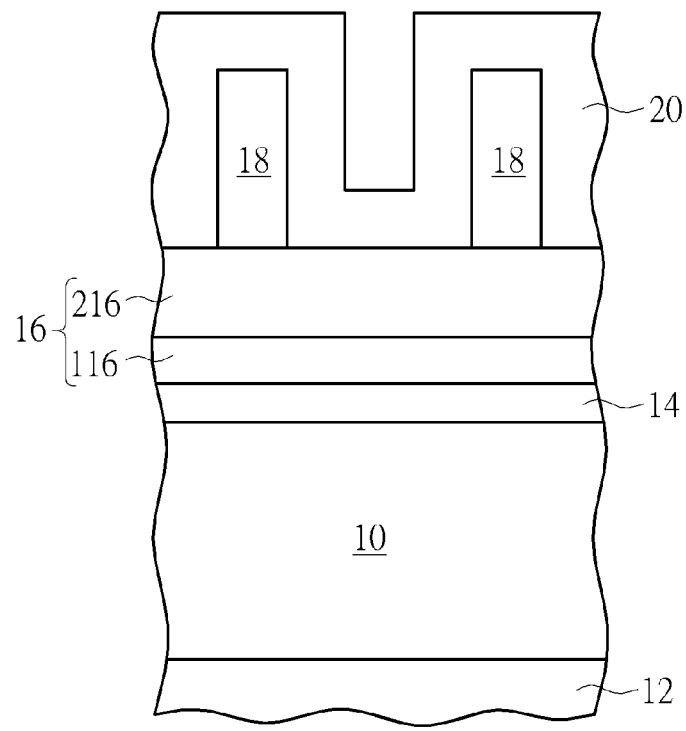
Figure 3:
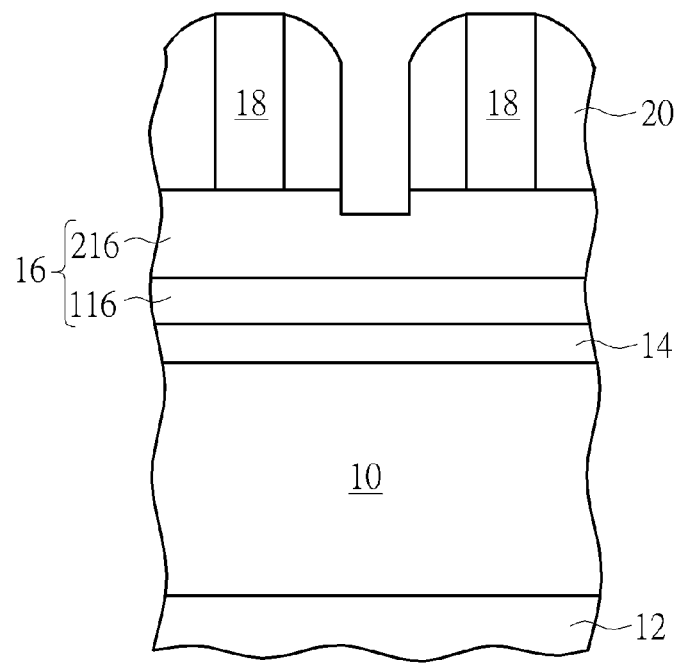
Figure 4:
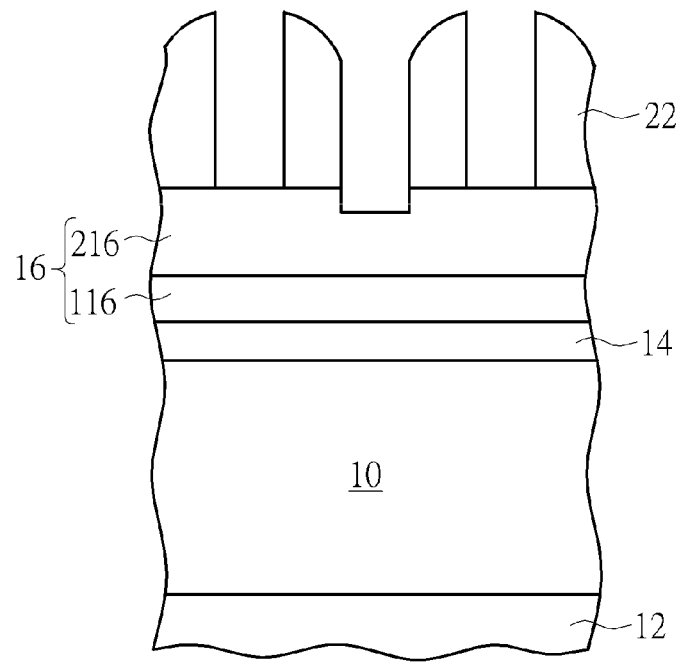

After performing the first method, at least two mandrels 18 are formed on the second mask 16. The mandrels 18 may be amorphous silicon. As shown in FIG. 2, a spacer material 20 is formed to conformally cover the mandrels 18 and the second mask 16. The spacer material 20 may be titanium oxide ($TiO_x$). As shown in FIG. 3, the spacer material 20 is etched to form two spacers 22 respectively at two sidewalls of each mandrel 18. When the spacer material 20 is etched, part of the second mask layer 16 is optionally etched. As shown in FIG. 4, the mandrels 18 are removed.

Figure 5:
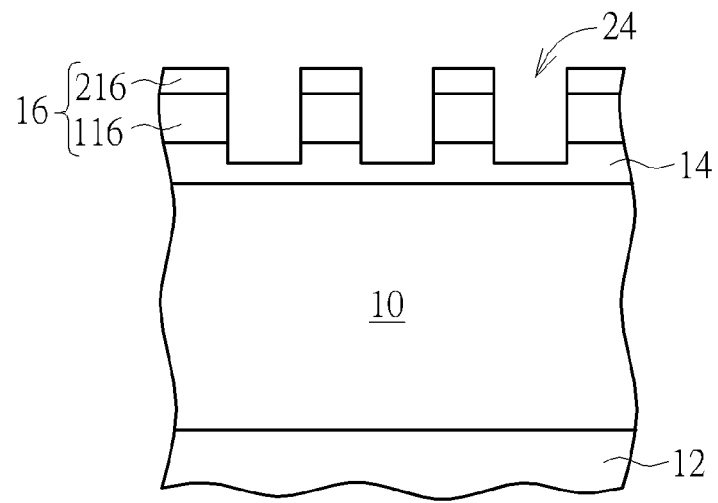

As shown in FIG. 5, the second mask 16 is patterned by taking the spacers 22 as a mask to form numerous recesses 24 within the second mask 16. The recesses 24 may optionally extend into the first mask 14. Then, the spacers 22 are removed completely.

Figure 6:
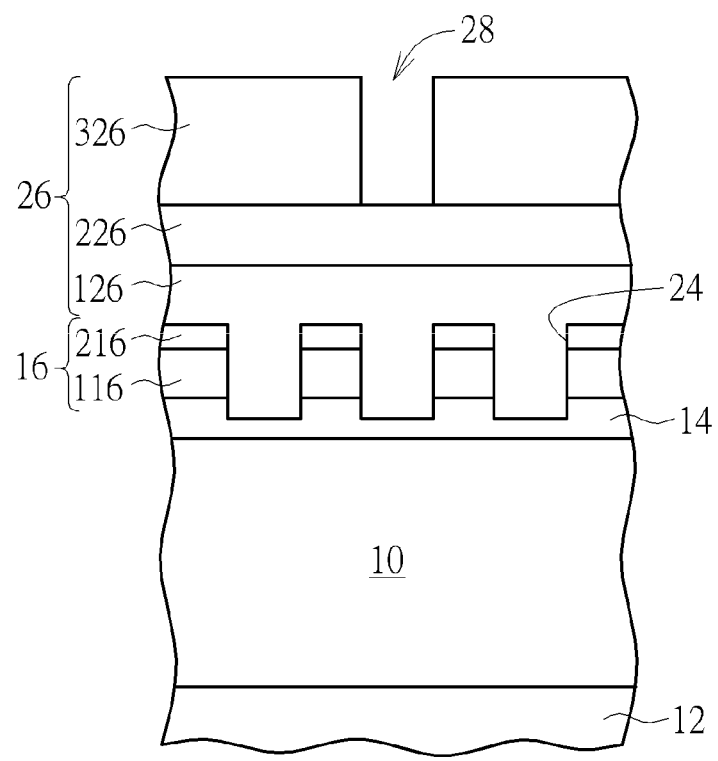

As shown in FIG. 6, a third mask 26 is formed to cover the second mask 16, and fills up the recesses 24. The third mask 26 includes a via pattern 28 therein. The third mask 26 may be multiple layers including a photoresist layer 326, an anti-reflecting coating 226 and an organic dielectric layer 126 disposed from top to bottom. The via pattern 28 is disposed in the photoresist layer 326. The via pattern 28 is aligned with one of the recesses 24.

Figure 7:
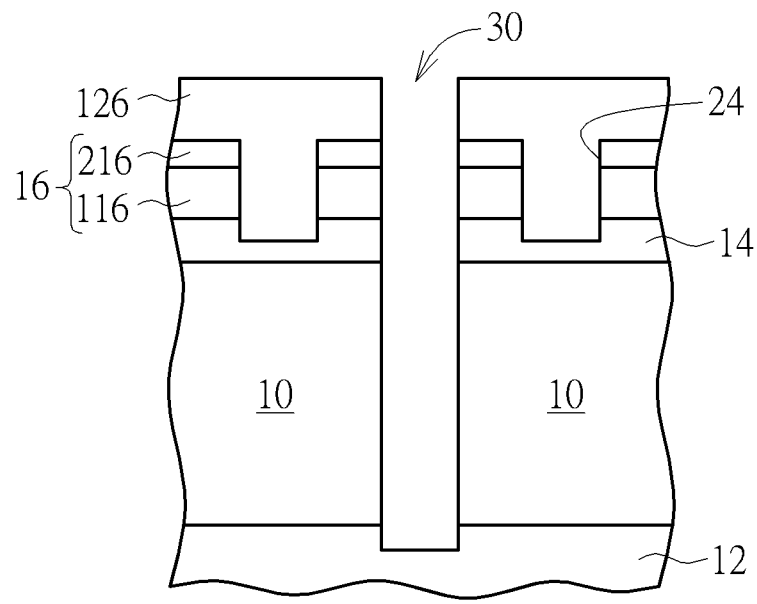
Figure 8:
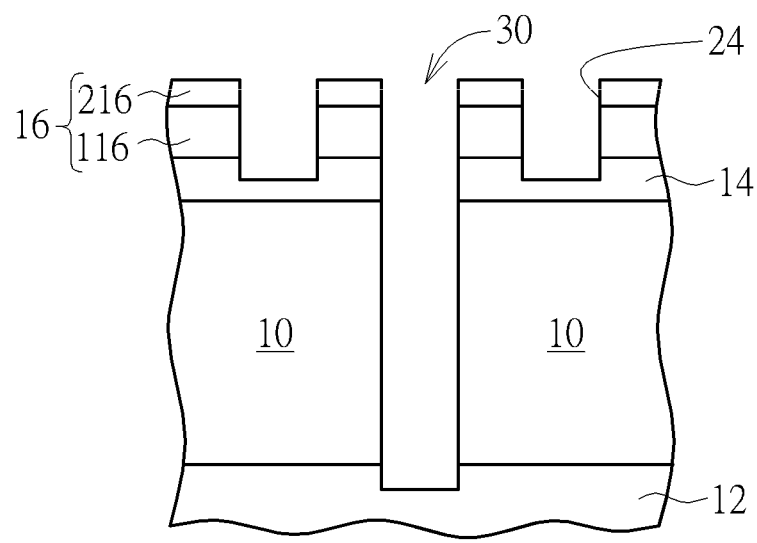

As shown in FIG. 7, a via 30 is formed in the dielectric layer 12 by taking the third mask 26 as a mask. During the formation of the via 30, the first mask 14 and the dielectric layer 10 is etched by an etching process taking the etching stop layer 12 as an etching stop layer. The etching process will be stopped when the etching stop layer 12 is exposed through the via 30. In some cases, when the dielectric layer 12 is etched, part of the third mask 26 is consumed. As shown in FIG. 8, the remaining third mask 26 is removed completely. According to the second method of preventing the distortion in the present invention, the third mask 26 is removed by performing a first ashing process in plasma containing oxygen, followed by preforming a second ashing process in plasma containing nitrogen and hydrogen.

As illustrated in FIG. 8, the third mask is then removed completely. A rinsing process is performed to clean the surface of the dielectric layer 10, the organic dielectric layer 126 of the second mask 26, the first mask 14 and the etching stop layer 12. According to the third method of preventing distortion, the rinsing process is performed by using solvent containing a low concentration of hydrophilic ions.

Figure 9:
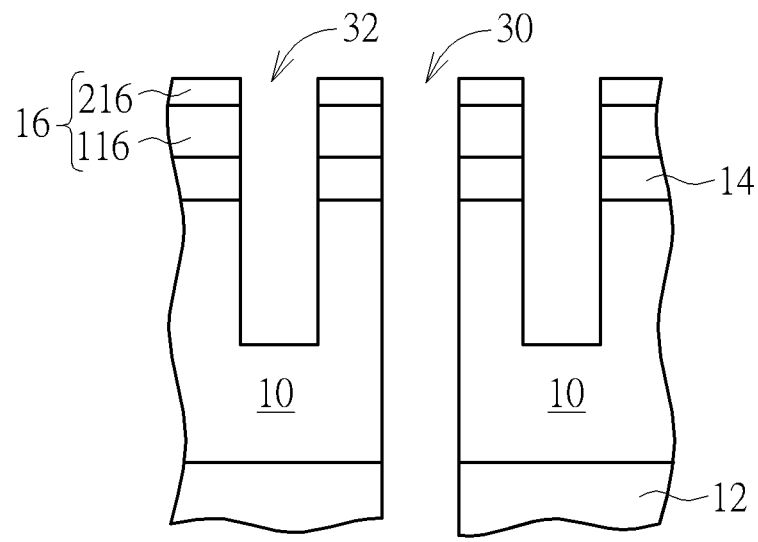

As shown in FIG. 9, numerous trenches 32 are formed in the dielectric layer 10 by taking the second mask 16 as a mask. The trenches 32 are formed by etching the dielectric layer 10 using an etching process. When forming the trenches 32, the etching stop layer 12 directly below the via 30 is also etched by taking the second mask 16 and the first mask 14 as masks to make the via 30 extend into the etching stop layer 12. At this point, the conductive lines on the substrate can be exposed through the via 30. After that, the rinsing process (which is the third method of preventing distortion) can be performed again to clean the surface of the dielectric layer 10, the second mask 16, the first mask 14 and the etching stop layer 12.

Figure 10:
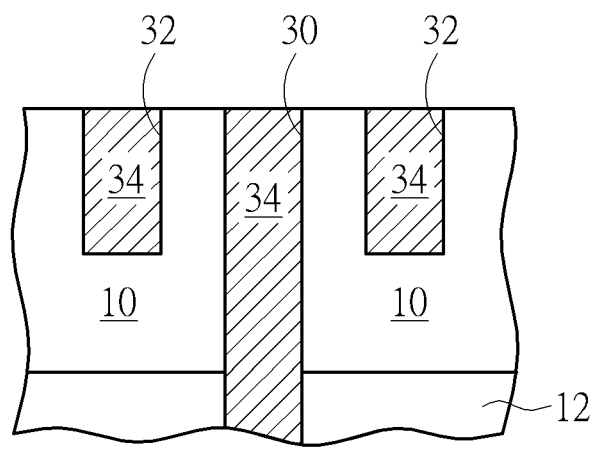

As shown in FIG. 10, the first mask 14 and the second mask 16 are removed. A metal 34 is formed to fill the trenches 32 and the via 30. The metal 34 may be copper, tungsten or aluminum but is not limited thereto. The metal 34 in the trenches 32 and the via 30 may form an interlayer connection having a dual damascene structure. Moreover, the metal 34 may contact the conductive line in the substrate below the dielectric layer 12.

The first method of preventing distortion according to the present invention limits the first mask 14 and the second mask 16 with stresses opposite in sign. Therefore, the stress formed in the second mask 16 can be compensated for by the first mask 14. In this way, when the trenches 32 are formed in the dielectric layer 10, the stress in the first mask 14 and the second mask 16 will not bend the sidewalls of the trenches 32 in an unexpected direction.

The second method of preventing the distortion according to the present invention removes the third mask 26 by the first ashing process performed in plasma containing oxygen, followed by the second ashing process performed in plasma containing nitrogen and hydrogen. If only the first ashing process is performed, the sidewalls of the via 30 in the dielectric layer 10 and sidewalls of the recess 24 in the first mask 14 and the second mask 16 will become hydrophilic. The hydrophilic sidewalls will be swollen after contacting and absorbing a conventional hydrophilic solvent used to clean the via 30 and the recess 24 after the third mask 26 is removed. The swollen sidewalls will bend. By performing the second ashing process after the first ashing process, however, the hydrophilic sidewalls formed during the first ashing process can be reduced to become more hydrophobic. In this way, the absorption of the conventional hydrophilic solvent of the sidewall can be decreased, and the sidewalls will not swell.

The third method of preventing distortion uses solvent containing a low concentration of hydrophilic ions to clean the via 30 or trenches 32 after an etching process. Because the sidewalls of the via 30 or the trenches 32 have low absorption of the solvent containing a low concentration of hydrophilic ions, the sidewall will not swell after the cleaning. Therefore, the distortion can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming trenches and a via by self-aligned double patterning, comprising:
    providing a dielectric layer covered by a first mask and a second mask, wherein the first mask has a first stress, and the second mask has a second stress, wherein the first stress and the second stress are opposite in sign;
    forming at least two mandrels on the second mask;
    forming two spacers respectively at two sidewalls of each of the mandrels;
    removing the mandrels;
    patterning the second mask by taking the spacers as a first hard mask to form a plurality of recesses;
    removing the spacers;
    forming a third mask covering the second mask, wherein the third mask comprises a via pattern;
    forming a via in the dielectric layer by taking the third mask as a second hard mask;
    removing the third mask; and
    forming a plurality of trenches in the dielectric layer by taking the second mask as a third hard mask.

2. The method of forming trenches and a via by self-aligned double patterning of claim 1, wherein the step of removing the third mask comprises:
    removing the third mask by a first ashing process performed in plasma containing oxygen; and
    after the first ashing processing, performing a second ashing process in plasma containing nitrogen and hydrogen.

3. The method of forming trenches and a via by self-aligned double patterning of claim 1, further comprising:
    after forming the trenches, rinsing the trenches, the first mask and the second mask with a solvent containing a low concentration of hydrophilic ions.

4. The method of forming trenches and a via by self-aligned double patterning of claim 1, wherein the first mask comprises SiON.

5. The method of forming trenches and a via by self-aligned double patterning of claim 1, wherein the second mask comprises TiN and SiOC.

6. The method of forming trenches and a via by self-aligned double patterning of claim 1, wherein the second mask is on the first mask.

7. The method of forming trenches and a via by self-aligned double patterning of claim 1, further comprising an etching stop layer disposed below the dielectric layer.

8. The method of forming trenches and a via by self-aligned double patterning of claim 7, wherein the trenches are formed by etching the dielectric layer.

9. The method of forming trenches and a via by self-aligned double patterning of claim 8, wherein when forming the trenches, the etching stop layer directly below the via is also etched by taking the second mask as a mask to make the via extend into the etching stop layer.

10. The method of forming trenches and a via by self-aligned double patterning of claim 1, further comprising:
    after removing the third mask and before forming the trenches, rinsing the via, the first mask and the second mask with a solvent containing a low concentration of hydrophilic ions.

11. The method of forming trenches and a via by self-aligned double patterning of claim 1, further comprising:
    after forming the trenches, filling the trenches and the via with metal.

12. The method of forming trenches and a via by self-aligned double patterning of claim 1, wherein the third mask comprises photoresist.

13. A method of forming trenches and a via by self-aligned double patterning, comprising:
    providing a dielectric layer covered by an SiOC layer, a TiN layer and an SiON layer from top to bottom;
    forming at least two mandrels on the SiOC layer;
    forming two spacers respectively at two sidewalls of each of the mandrels;
    removing the mandrels;
    patterning the SiOC layer and the TiN layer by taking the spacers as a mask to form a plurality of recesses;
    removing the spacers;
    forming a mask layer with a via pattern thereon covering the SiOC layer;
    forming a via in the dielectric layer by taking the mask layer as a mask;
    removing the mask layer; and
    forming a plurality of trenches in the dielectric layer by taking the SiOC layer and the TiN layer as a mask.

14. The method of forming trenches and a via by self-aligned double patterning of claim 13, wherein the SiON layer comprises tensile stress.

15. The method of forming trenches and a via by self-aligned double patterning of claim 13, wherein the TiN layer and the SiOC layer together comprise compressive stress.

16. The method of forming trenches and a via by self-aligned double patterning of claim 13, further comprising:
    after forming the trenches, filling the trenches and the via with metal.

17. A method of forming trenches and a via by self-aligned double patterning, comprising:
    providing a dielectric layer covered by a mask with a pattern thereon;
    forming a via in the dielectric layer by using the mask as a hard mask;
    removing the mask by a first ashing process performed in plasma containing oxygen, followed by performing a second ashing process in plasma containing nitrogen and hydrogen; and
    after removing the mask, rinsing the via and the dielectric layer with a solvent containing a low concentration of hydrophilic ions.

\* \* \* \* \*